(12) United States Patent
Boerstler et al.

(10) Patent No.: US 7,289,926 B2
(45) Date of Patent: Oct. 30, 2007

(54) SYSTEM AND METHOD FOR EXAMINING HIGH-FREQUENCY CLOCK-MASKING SIGNAL PATTERNS AT FULL SPEED

(75) Inventors: David W. Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 11/168,722

(22) Filed: Jun. 28, 2005

(65) Prior Publication Data

US 2007/0005279 A1 Jan. 4, 2007

(51) Int. Cl.
*G01M 19/00* (2006.01)
(52) U.S. Cl. ..................................... 702/125
(58) Field of Classification Search .................. 702/125
See application file for complete search history.

(56) References Cited

U.S. PATENT DOCUMENTS

| | | | |
|---|---|---|---|
| 3,790,885 A | 2/1974 | James | |
| 4,472,738 A | 9/1984 | Hada et al. | |
| 4,744,047 A | 5/1988 | Okamoto et al. | |
| 4,962,541 A | 10/1990 | Doi et al. | |
| 6,684,350 B1 | 1/2004 | Theodoras, II et al. | |
| 6,687,662 B1 | 2/2004 | McNamara et al. | |
| 6,842,245 B2 | 1/2005 | Ando | |
| 7,134,056 B2 * | 11/2006 | Kleveland et al. | 714/704 |
| 2002/0010878 A1 * | 1/2002 | Ernst et al. | 714/25 |

OTHER PUBLICATIONS

"Circuit to Reduce Transient Current Swings During Mode Transitions of High Frequency/High Power Chips" U.S. Appl. No. 10/981,154, filed Nov. 4, 2004.

* cited by examiner

*Primary Examiner*—Michael P. Nghiem
*Assistant Examiner*—Lisa Sievers
(74) *Attorney, Agent, or Firm*—Carr LLP; D'Ann N. Rifai

(57) ABSTRACT

The present invention provides for a method for examining high-frequency clock-masking signal patterns at a reduced frequency. A first mode of a first shift register is selected. A plurality of bits is loaded on the first shift register at a first frequency. A second mode of the first shift register is selected. A first mode of a second shift register is selected. The plurality of bits is loaded on the second shift register. A second mode of the second shift register is selected. A first mode of a third shift register is selected. The plurality of bits is loaded on the third shift register. A second mode of the third shift register is selected and the plurality of bits is loaded from the third shift register at a second frequency, where the second frequency is lower than the first frequency, thereby providing for examining high-frequency clock-masking signal patterns at a reduced frequency.

20 Claims, 4 Drawing Sheets

SYSTEM AND METHOD FOR EXAMINING HIGH-FREQUENCY CLOCK-MASKING SIGNAL PATTERNS AT FULL SPEED

TECHNICAL FIELD

The present invention relates generally to the field of circuit design and testing and, more particularly, to a system and method for examining high-frequency clock-masking signal patterns at full speed.

BACKGROUND

Many modern electronic devices, such as, for example, computer processors, chips, and circuits, often employ a high frequency signal to provide a clock signal. However, there are some applications where flexibility in the clock frequency is desired, without requiring extensive additional hardware. Recent developments in electronic devices include circuits that can divide down high-frequency clocks in a controlled manner, which can provide desired flexibility in clock frequency, such that the fluctuation in signal current over time, di/dt, associated with the division is minimized. One skilled in the art will understand that by minimizing di/dt, power supply integrity can be improved, and that power supply integrity is increasingly important as supply voltages are scaled down.

In one such recently-developed circuit, generally, a shift register loads a set of code patterns for high-frequency clock-masking in a parallel manner. Once the loading process is complete, the shift register shifts into a serial mode and runs the patterns in a round-robin manner. One skilled in the art will understand that in a serial (round-robin) configuration, the last bit in the shift register shifts to the first bit-position, instead of or in addition to shifting out of the shift register. A system can then use the output of the shift register to mask out specific pulses of the high-frequency clock, thereby achieving the desired frequency division.

For example, an end-use system, such as, for example, a processor and/or circuit that uses a clock signal at a lower frequency than the provided high-frequency clock signal can employ the shift register output to mask the high-frequency clock. Additionally, an intermediate-use system, such as, for example, a processor and/or circuit that, in part, provides a clock signal at a lower frequency than the high-frequency clock signal to other systems and/or components, can also employ the shift register output to mask the high-frequency clock. One skilled in the art will understand that other configurations can also be employed.

For further illustration, FIG. 1 depicts a representation 100 of a general implementation of two bits of a shift register configured to operate in parallel mode and serial (round-robin) mode. As illustrated, the block labeled "Control n" 105 receives two control inputs. One control input is a clock signal (CLK) 110 and the other control input is a control signal (Parallel/Serial select 115) that indicates whether the system is to operate in serial (round-robin) mode or parallel mode. The "Control n" block 105 receives the two control inputs 110 and 115, and, in a synchronous manner, enables/disables the parallel and serial paths of the shift register, as will be understood to one skilled in the art. More particularly, Parallel/Serial select signal 115 determines whether certain gates will be open or closed, by controlling serial select signal 120 and parallel select signal 125. Serial select signal 120 controls gate 122 and parallel select signal 125 controls gate 127.

During the transitions between parallel and serial modes, if the clock frequency is high, an indeterminate state can latch on to the flip-flops (FFs)/latches of "bit n" 130 in the shift register 135. For example, during the parallel mode of operation, "Control n" block 105 selects the path indicated by arrow "A" 140 in FIG. 1 and disables the path indicated by arrow "B" 145, as one skilled in the art will understand. Similarly, when "Control n" block 105 disables the parallel mode and enables the serial mode, "Control n" block 105 disables path "A" 140 and enables path "B" 145.

During this transition period, shifting from serial input from "Node 2" 155 to parallel input from parallel input bit n 160, "Node 1" 150, the input to "bit n" 130 of the shift register 135, can be in a state that is not well defined. In particular, CLK 110 keeps the input FF/latch of "bit n" 130 open for a maximum time equal to T/2, where T is the period of CLK 110. Assuming that it takes Tb time for a signal from "Node 2" 155 in FIG. 1 to arrive at "Node 1" 150, the probability that the not-well-defined state at "Node 1" 150 will latch onto "bit n" 130 of shift register 135 increases as the magnitudes of Tb and T/2 become comparable.

Thus, as Tb and T/2 become comparable, particularly at high clock frequencies, a not-well-defined state at "Node 1" 150 can occur. Therefore, in systems that use the shift register 135 output to mask phase locked loop (PLL) clock signals to generate lower frequency clocks, it is important to be able to verify the contents of the shift register 135 over time. In practice, this verification typically includes loading the parallel bits and observing the serial (round-robin) output of the shift register 135 at full speed to ensure the shift register 135 contains the desired code.

Generally, there are two typical options to test such a circuit at full speed in a manufacturing/lab environment. In one case, a test engineer, for example, can construct a laboratory setup that has a very high bandwidth (>5 GHz) and, therefore, is capable of directly monitoring the output of the di/dt reducing circuit, that is, the serial (round-robin) output of the shift register. However, a lab setup with sufficient bandwidth to characterize the system running at full speed at very high frequencies can be very expensive to maintain and therefore can be cost prohibitive in many environments.

In another case, a test engineer, for example, can employ a series of serial registers to store the data from the outputs. However, this approach can require the introduction of a large number of on-chip serial registers. For example, there can be thousands of cycles of system output to store, requiring a large hardware increase. Similarly, the number of serial shift registers available limits the number of cycles that can be observed. Generally, if the system has "n" bits and it is desirable to observe "y" cycles, the serial shift register will need at least yXn latches. Thus, for example, for an n-bit di/dt reducing circuit, 10Xn serial shift registers are necessary to observe 10 cycles of the circuit. Introducing many additional shift registers can consume a large area as well as a significant amount of power.

Therefore, there is a need for a system and/or method for examining high-frequency clock-masking signal patterns at full speed that addresses at least some of the problems and disadvantages associated with conventional systems and methods.

SUMMARY

The present invention provides for a method for examining high-frequency clock-masking signal patterns at a reduced frequency. A first mode of a first shift register is selected. A plurality of bits is loaded on the first shift register at a first frequency. A second mode of the first shift register is selected. A first mode of a second shift register is selected. The plurality of bits is loaded on the second shift register. A second mode of the second shift register is selected. A first mode of a third shift register is selected. The plurality of bits is loaded on the third shift register. A second mode of the third shift register is selected and the plurality of bits is loaded from the third shift register at a second frequency, where the second frequency is lower than the first frequency, thereby providing for examining high-frequency clock-masking signal patterns at a reduced frequency.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The following discussion sets forth numerous specific details to provide a thorough understanding of the present invention. However, those skilled in the art will appreciate that the present invention may be practiced without such specific details. In other instances, the following discussion illustrates well-known elements in schematic or block diagram form in order not to obscure the present invention in unnecessary detail. Additionally, for the most part, the following discussion omits details concerning network communications, electro-magnetic signaling techniques, user interface or input/output techniques, and the like, inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, a processor such as a computer or an electronic data processor performs the functions in accordance with code such as computer program code, software, and/or integrated circuits that are coded to perform such functions, unless indicated otherwise.

Figure 1:
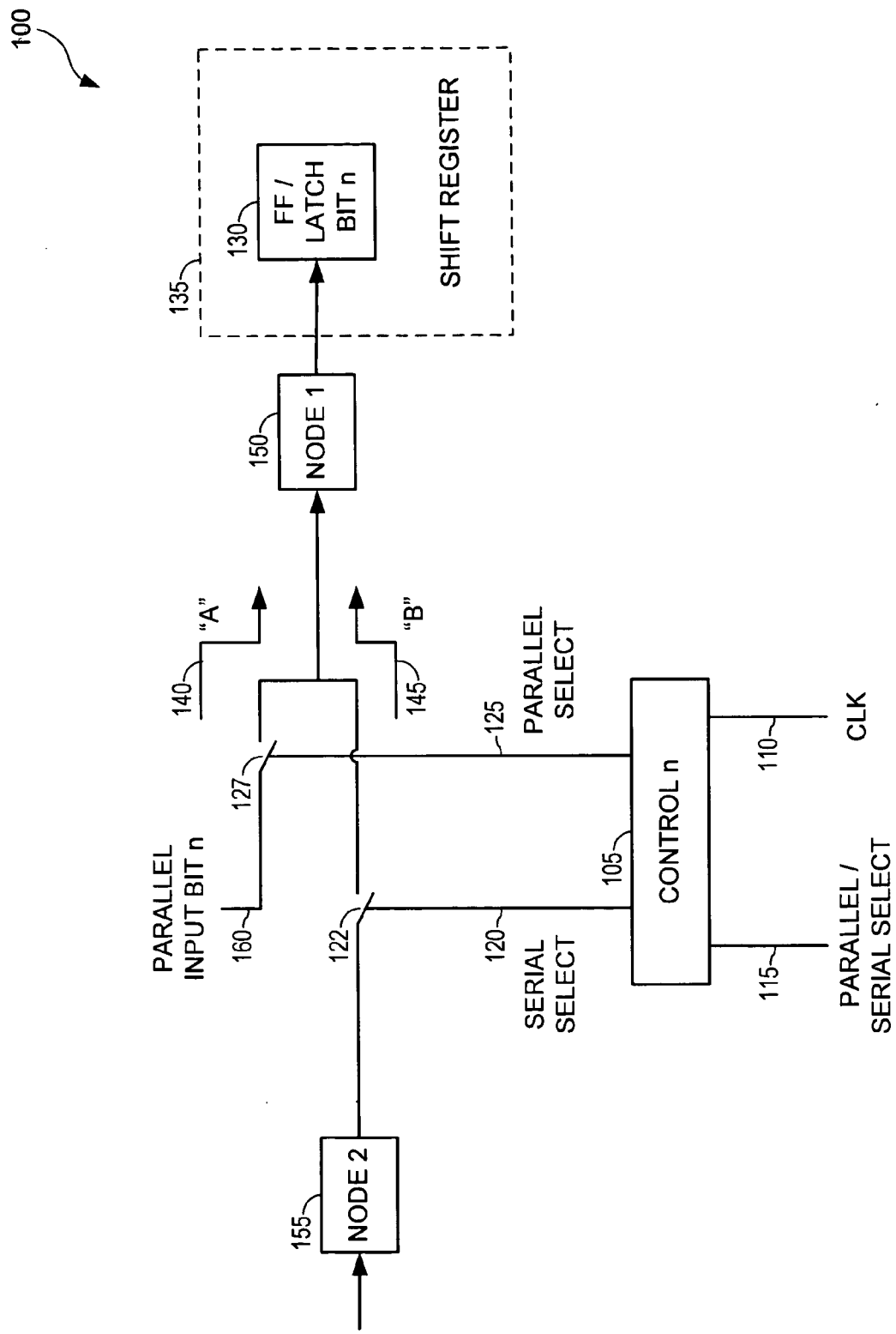
FIG. 1 is a block diagram depicting a general implementation of two bits of a shift register.
Figure 2:
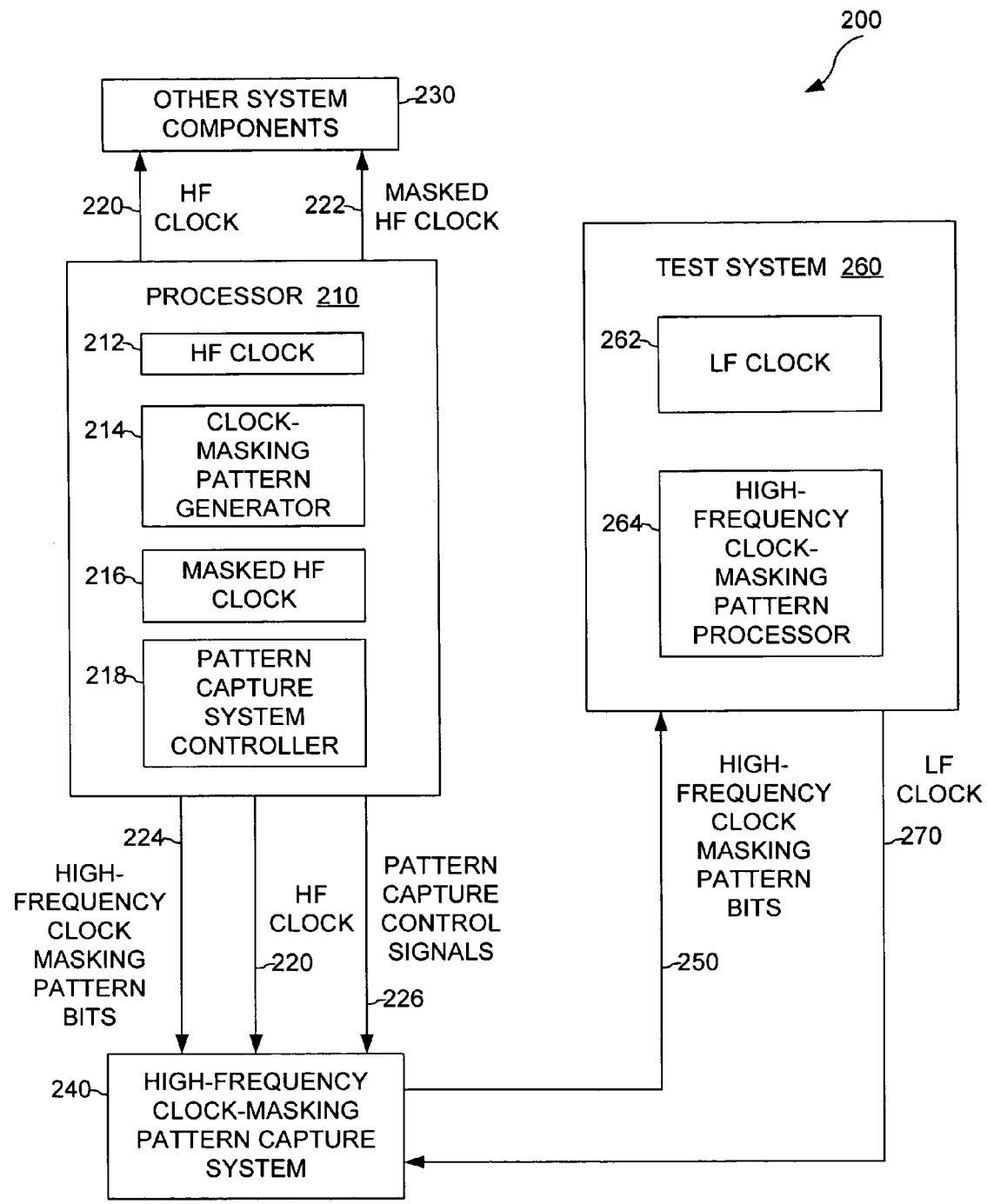
FIG. 2 is a block diagram depicting a computer system.

FIG. 2 depicts a computer system 200. Computer system 200 includes processor 210, which is configured as a computer processor, as described in more detail below. In particular, processor 210 includes high-frequency (HF) clock 212, as one skilled in the art will understand. HF clock 212 generates a high-frequency clock signal, HF clock 220.

Processor 210 also includes clock-masking pattern generator 214. Clock-masking pattern generator 214 is a circuit or circuits or other suitable logic and is configured to generate one or more of a series of high-frequency clock-masking pattern bits 224. In one embodiment, a series of high-frequency clock-masking pattern bits include a plurality of logic high and/or logic low bits. In the illustrated embodiment, clock-masking pattern generator 214 transmits or otherwise communicates the one or more of a series of high-frequency clock-masking pattern bits 224 to masked HF clock 216.

Masked HF clock 216 is an otherwise conventional clock that is configured to receive the one or more of a series of high-frequency clock-masking pattern bits 224 from clock-masking pattern generator 214. Additionally, masked HF clock 216 employs the received one or more of a series of high-frequency clock-masking pattern bits 224 to generate a masked HF clock 222. In one embodiment, masked HF clock 216 receives the HF clock signal 220 from HF clock 212, correlates the received HF clock signal 220 with the received one or more of a series of high-frequency clock-masking pattern bits 224, and generates the masked HF clock 222 based on the received HF clock signal 220 and the received one or more of a series of high-frequency clock-masking pattern bits 224. In particular, masked HF clock 216 suppresss a clock pulse of HF clock signal 220 when the corresponding bit of the received high-frequency clock-masking pattern bits 224 is at a logic low. Additionally, masked HF clock 216 transmits a clock pulse of HF clock signal 220, or otherwise generates a clock pulse when the corresponding bit of the received high-frequency clock-masking pattern bits 224 is at a logic high.

Processor 210 also includes pattern capture system controller 218. Pattern capture system controller 218 is an otherwise conventional controller that is configured to generate one or more pattern capture control signals 226, and to transmit generated pattern capture control signals 226 to a high-frequency clock-masking pattern capture system 240. In a particular embodiment, pattern capture control signals 226 include a first parallel/serial select signal, a serial disable signal, and a second parallel/serial select signal, as described in more detail below.

Processor 210 also transmits HF clock signal 220 and masked HF clock 222 to other system components 230. For ease of illustration, as one skilled in the art will understand, FIG. 2 depicts the various well-known computer components that employ HF clock signal 220 and masked HF clock 222 as a collective block labeled "other system components 230."

Processor 210 also transmits HF clock signal 220, high-frequency clock-masking pattern bits 224, and pattern capture control signals 226 to high-frequency clock-masking pattern capture system 240. High-frequency clock-masking pattern capture system 240 is described in more detail with respect to FIG. 3, below. In the illustrated embodiment, high-frequency clock-masking pattern capture system 240 transmits high-frequency clock-masking pattern bits 250 to test system 260, and receives a low-frequency (LF) clock signal 270 from test system 260, as described in more detail below.

Test system 260 includes LF clock 262 and high-frequency clock-masking pattern processor 264, and receives high-frequency clock-masking pattern bits 250 from high-frequency clock-masking pattern capture system 240, and transmits a LF clock signal 270 to high-frequency clock-masking pattern capture system 240. In particular, LF clock 262 is a low-frequency clock, and generates LF clock signal 270.

High-frequency clock-masking pattern processor 264 is an otherwise conventional processor and is configured to receive and process high-frequency clock-masking pattern bits 250. Processing received high-frequency clock-masking pattern bits 250 can include translating received pattern bits to a human-readable form, displaying translated pattern bits to a user through a user interface, comparing received pattern bits with a known, pre-determined pattern, displaying the results of such a comparison to a user through a user interface, and/or other suitable processing steps well-known to one skilled in the art.

Figure 3:
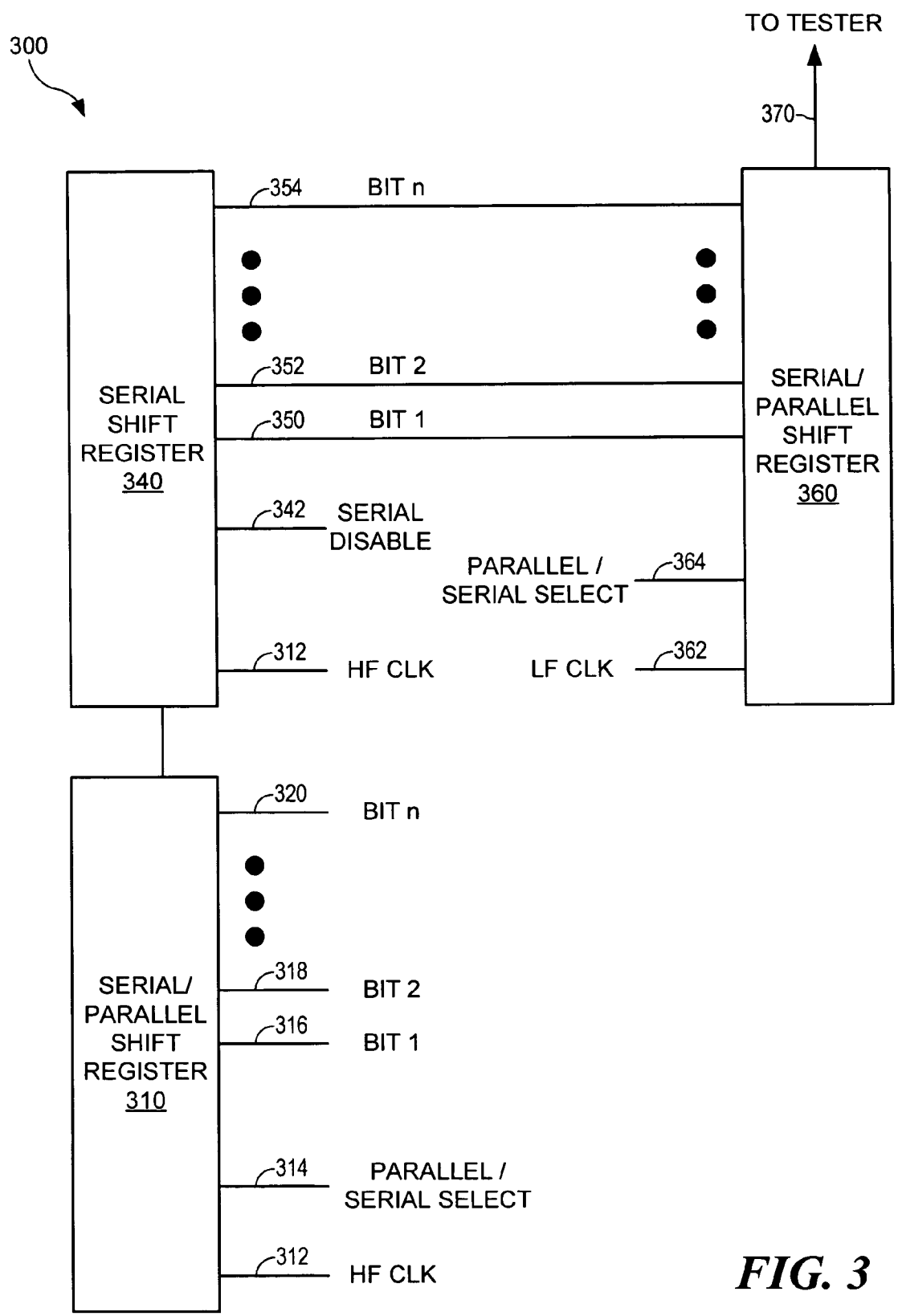
FIG. 3 is a block diagram depicting a system for examining high-frequency clock-masking signal patterns at full speed.

FIG. 3 depicts a high-frequency clock-masking pattern capture system 300. Generally, high-frequency clock-masking pattern capture system 300 includes two identical, or nearly identical, serial/parallel shift registers 310 and 360, and a serial-only shift register 340. In particular, high-frequency clock-masking patter capture system 300 includes serial/parallel shift register 310. Serial/parallel shift register 310 is a dual-mode serial/parallel shift register, as one skilled in the art will understand.

In particular, in one embodiment, serial/parallel shift register 310 receives a high-frequency clock signal HF CLK 312, such as, for example, HF CLK 220 from processor 210 of FIG. 2, a parallel/serial select signal 314, such as, for example, as a pattern capture control signal 226 from processor 210 of FIG. 2, and a plurality of data bits, 316, 318, through 320, such as, for example, high-frequency clock-masking pattern bits 224 from processor 210 of FIG. 2. In the illustrated embodiment, serial/parallel shift register 310 operates at the full system speed. In typical embodiments, the full system speed can exceed 5 GHz.

Generally, serial/parallel shift register 310 receives the data bits 316, 318, through 320 in parallel at the high-frequency, or full system clock speed, based on the parallel/serial select signal 314, as described in more detail below. In particular, in one embodiment, when processor 210 asserts the parallel/serial select signal 314, serial/parallel shift register 310 receives the data bits 316, 318, through 320 in parallel. Similarly, when processor 210 de-asserts the parallel/serial select signal 314, serial/parallel shift register 310 shifts the received data bits 316, 318, through 320 in a serial, round-robin manner.

That is, in serial (round-robin) mode, serial/parallel shift register 310 shifts "bit n" 320 to "bit 1" 316 and out as output, and shifts "bit 1" 316 to "bit 2" 318, and so forth, as one skilled in the art will understand. Additionally, in serial (round-robin) mode, serial/parallel shift register 310 is configured not to receive additional bits from its parallel inputs.

Serial/parallel shift register 310 couples to serial shift register 340 at serial link 330. Serial link 330 is any suitable serial link and is well known to those skilled in the art. Serial shift register 340 is configured as a serial shift register, as one skilled in the art will understand. In particular, in one embodiment, serial shift register 340 receives the high-frequency clock signal HF CLK 312, a serial disable signal 342, such as, for example, as a pattern capture control signal 226 from processor 210 of FIG. 2, and a plurality of data bits 316, 318, through 320 from serial/parallel shift register 310. In the illustrated embodiment, serial shift register 340 operates at the full system speed.

Generally, serial shift register 340 receives the data bits 316, 318, through 320 from serial/parallel shift register 310 through serial link 330, in serial at the high-frequency, or full system clock speed, in response to the serial disable signal 342, as described in more detail below. In particular, in one embodiment, when processor 210 de-asserts the serial disable signal 342, serial shift register 340 receives the plurality of data bits 316, 318, through 320 in serial from serial/parallel shift register 310 through serial link 330. Similarly, when processor 210 asserts the serial disable signal 342, serial shift register 340 retains the received data bits 316, 318, through 320 in a serial, but not round-robin, manner. Additionally, when processor 210 asserts the serial disable signal 242, serial shift register 340 also outputs the received plurality of data bits in parallel as data bits 350, 352, through 354. One skilled in the art will understand that collectively bits 350, 352, through 354 correspond to bits 316, 318, through 320. However, because of the serial (round-robin) action of serial/parallel shift register 310, while bits 350, 352, through 354 maintain the general sequence of bits 316, 318, through 320, bit 350, for example, can correspond to a different bit than bit 316 of bits 316, 318, through 320.

Serial shift register 340 couples to serial/parallel shift register 360. Serial/parallel shift register 360 is an otherwise conventional shift register that is configured as a dual-mode serial/parallel shift register, as one skilled in the art will understand. In particular, in one embodiment, serial/parallel shift register 360 receives a low-frequency clock signal LF CLK 362, such as, for example, LF CLK 270 from test system 260 of FIG. 2, a parallel/serial select signal 364, such as, for example, as a pattern capture control signal 226 from processor 210 of FIG. 2, and a plurality of data bits 350, 352, through 354 from serial shift register 340.

In one embodiment, serial/parallel shift register 360 is configured identically to serial/parallel shift register 310. In the illustrated embodiment, serial/parallel shift register 360 operates at a low frequency that is within the bandwidth of the laboratory setup that employs high-frequency clock-masking patter capture system 300, such as, for example, test system 260 of FIG. 2. In some embodiments, the low frequency can be below 1 GHz.

Generally, serial/parallel shift register 360 receives the plurality of data bits 350, 352, through 354 in parallel from serial shift register 340 at the low-frequency clock signal LF CLK 362 speed, in response to the parallel/serial select signal 364, as described in more detail below. In particular, in one embodiment, when processor 210 asserts the parallel/serial select signal 364, serial/parallel shift register 360 receives the data bits 350, 352, through 354 in parallel. Similarly, when processor 210 de-asserts the parallel/serial select signal 364, serial/parallel shift register 360 shifts the received data bits 350, 352, thorough 354 in a serial (round-robin) manner. Additionally, in serial (round-robin) mode, serial/parallel shift register 360 is configured not to receive additional bits from its parallel inputs.

Generally, in operation, the full-speed, high-frequency clock HF CLK 312 drives serial/parallel shift register 310 and serial shift register 340 and the slower low-frequency clock LF CLK 362 drives the serial/parallel shift register 360. For ease of illustration, the following discussion describes the period of the HF clock as "THF" and the period of the LF clock as "TLF".

Initially, at time t1, processor 210 asserts the parallel/serial select signal 314 for serial/parallel shift register 310 and loads a new set of high-frequency clock-masking pattern code, the plurality of data bits 316, 318, through 320, in parallel, to serial/parallel shift register 310. For ease of illustration, the times described herein are relative, and not necessarily sequential clock signals. Accordingly, one skilled in the art will understand that several clock cycles can elapse between, for example, time t1 and time t2. Once loading is completed, at time t2, processor 210 de-asserts the parallel/serial select signal 314 for serial/parallel shift register 310, switching serial/parallel shift register 310 to serial (round-robin) mode. During time t2, serial/parallel shift register 310 shifts the loaded data bits in serial (round-robin) fashion, shifting each bit one bit-position per clock cycle.

Next, at time t3, processor 210 de-asserts the serial disable signal 342 for serial shift register 340, and serial shift register 340 loads, in serial, the output of serial/parallel shift register 310 onto the bits 350, 352, through 354 of serial shift register 340. At time t4, processor 210 asserts the serial disable signal 342 for serial shift register 340, thereby disabling the output of serial/parallel shift register 310 from loading onto the bits 350, 352, through 354 of serial shift register 340, as described above.

One skilled in the art will understand, however, that during time t4 the output bits of serial shift register 340 retain their value prior to the assertion of the serial disable signal 342. Thus, in order to ensure that serial shift register 340 loads the entirety of the pattern loaded in serial/parallel shift register 310 during time t1, the difference between the number of clock cycles during time t4 and t3 can be configured to exceed the product of THF and the number of bits in the pattern. That is, (t4−t3)>(nTHF), where "n" is the number of bits in serial/parallel shift register 310.

At time t5, processor 210 asserts, the parallel/serial select signal 364 for serial/parallel shift register 360 and serial/parallel shift register 360 loads the n bits of serial shift register 340. During time t5, the loading process of serial/parallel shift register 360, the serial disable signal 342 for serial shift register 340 remains asserted. Once the loading onto serial/parallel shift register 360 is completed, then, at time t6, processor 210 de-asserts the parallel/serial select signal 364 for serial/parallel shift register 360. During time t6, processor 210 de-asserts the serial disable signal 342 for serial shift register 340, and serial shift register 340 can load additional data bits from serial/parallel shift register 310. Thus, at time t6, serial/parallel shift register 360 is operating in a serial (round-robin) mode, at the low frequency that is within the bandwidth of the lab setup, such as, for example, test system 260 of FIG. 2. That is, during time t6, serial/parallel shift register 360 shifts the loaded data bits in serial (round-robin) fashion, shifting each bit one bit-position per LF clock cycle, shifting the last bit both out to the test system and to the first bit-position. Therefore, one can observe the output of serial/parallel shift register 360 using a typical laboratory setup, such as, for example, test system 260 of FIG. 2.

Accordingly, generally, serial/parallel shift register 360, which is running at a relatively slow frequency within the bandwidth of the laboratory test setup, stores the patterns of serial/parallel shift register 310, which is running at a higher frequency. If the patterns in serial/parallel shift register 310 are wrong, in terms of the desired high-frequency clock-masking signal patterns, the patterns in serial/parallel shift register 360 will also be wrong. Hence, by sampling the output 370 of serial/parallel shift register 360, a person, device, or process can observe the operation of the full-speed serial/parallel shift register 310.

Additionally, a person, device, or process can repeat this sample-and-store operation as many times as desired and observe repeatability of the high-frequency clock-masking signal patterns without requiring a large chain of serial shift registers to store many cycles of the outputs of serial/parallel shift register 310. A person, device, or process can sample the values of the system under test, running at full speed, once every "n" clock cycles, where "n" is the number of bits in the full speed system. Thus, high-frequency clock-masking pattern capture system 300 can be configured to observe as many cycles as desired of di/dt reducing-circuit outputs. It is also capable of performing full-speed tests in an ordinary low-frequency laboratory setup. Thus, high-frequency clock-masking pattern capture system 300 can be configured for applications in ordinary laboratory setups, without introducing excessive additional on-chip or laboratory hardware, and can be employed in manufacturing-test type environments.

Figure 4:
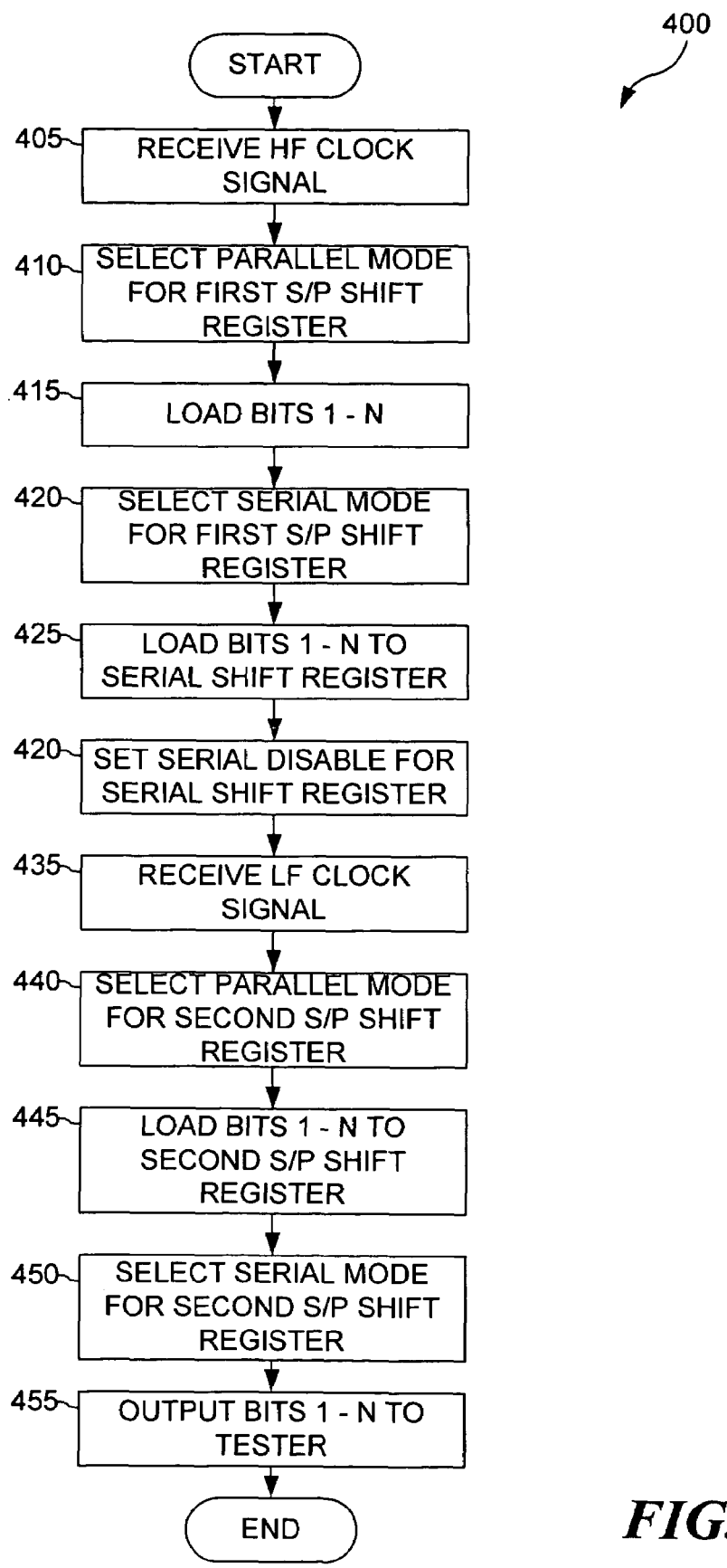
FIG. 4 is a flow diagram depicting a method for examining high-frequency clock-masking signal patterns at full speed.

FIG. 4 depicts a flow diagram 400 illustrating a high-frequency clock-masking signal pattern examination method. The process begins at step 405, wherein a first serial/parallel shift register receives a high-frequency clock signal from a processor. Serial/parallel shift register 310 of FIG. 3, for example, can perform this step, receiving HF CLK 220 from processor 210 of FIG. 2. At next step 410, the first serial/parallel shift register selects a parallel mode for the first serial/parallel shift register. Processor 210 of FIG. 2, for example, can perform this step, asserting a parallel/serial select signal 314 for serial/parallel shift register 310 of FIG. 3.

At next step 415, the first serial/parallel shift register loads a plurality of bits, bits 1 through bit n, in parallel from the processor. Serial/parallel shift register 310 of FIG. 3, for example, can perform this step, loading high-frequency clock-masking pattern bits 224 from processor 210 of FIG. 2. At next step 420, the first serial/parallel shift register selects a serial (round-robin) mode for the first serial/parallel shift register. Processor 210 of FIG. 2, for example, can perform this step, de-asserting a parallel/serial select signal 314 for serial/parallel shift register 310 of FIG. 3.

At next step 425, a serial shift register loads the plurality of bits in serial from the first serial/parallel shift register. Serial shift register 340 of FIG. 3, for example, can perform this step, loading the plurality of bits from serial/parallel shift register 310 of FIG. 3. In one embodiment, this step includes the processor de-asserting a serial disable signal 342 for the serial shift register 340. At next step 430, the serial shift register selects a serial disable mode. Processor 210 of FIG. 2, for example, can perform this step, asserting serial disable signal 342 for serial shift register 340 of FIG. 3.

At next step 435, a second serial/parallel shift register receives a low-frequency clock signal from a test system. Serial/parallel shift register 360 of FIG. 3, for example, can perform this step, receiving LF CLK 270 from test system 260 of FIG. 2. One skilled in the art will understand that step 435 can be performed contemporaneously with the above steps and/or otherwise performed on a continuous basis. At next step 440, the second serial/parallel shift register selects a parallel mode for the second serial/parallel shift register. Serial/parallel shift register 360 of FIG. 3, for example, can perform this step. In one embodiment, this step includes processor 210 of FIG. 2 asserting a parallel/serial select signal 364 for serial/parallel shift register 360 of FIG. 3.

At next step 445, the second serial/parallel shift register loads the plurality of bits from the serial shift register. Serial/parallel shift register 360 of FIG. 3, for example, can perform this step, loading the plurality of bits from serial shift register 340. At next step 450, the second serial/parallel shift register selects a serial (round-robin) mode for the second serial/parallel shift register. Processor 210 of FIG. 2, for example, can perform this step, de-asserting a parallel/serial signal 364 for serial/parallel shift register 360 of FIG. 3. At next step 455, the second serial/parallel shift register outputs the plurality of bits, in serial, to a tester, and the process ends. Serial/parallel shift register 360 of FIG. 3, for example, can perform this step.

Thus, one can test a high-frequency clock-masking system at full speed, with periodic sampling of the high-frequency clock-masking signal patterns. One can observe the periodic sampling for test or other purposes in a bandwidth-limited laboratory setup, with the second serial/parallel shift register configured to operate within the laboratory bandwidth limitations. Additionally, one can avoid large shift registers or other increased hardware requirements for testing code patterns.

The particular embodiments disclosed above are illustrative only, as one can modify the invention and practice the invention in different but equivalent manners apparent to those skilled in the art having the benefit of the teachings herein. Furthermore, no the foregoing discussion intends no limitations to the details of construction or design herein shown, other than as described in the claims below. It is therefore evident that one may alter or modify the particular embodiments disclosed above and that all such variations are within the scope and spirit of the invention. Accordingly, the claims below set forth the protection sought herein.

What is claimed is:

1. A method for examining high-frequency clock-masking signal patterns at a reduced frequency, comprising:
   selecting a first mode of a first shift register;
   loading a plurality of bits on the first shift register at a first frequency;
   selecting a second mode of the first shift register;
   selecting a first mode of a second shift register;
   loading the plurality of bits on the second shift register;
   selecting a second mode of the second shift register;
   selecting a first mode of a third shift register;
   loading the plurality of bits on the third shift register;
   selecting a second mode of the third shift register; and
   loading the plurality of bits from the third shift register at a second frequency, where the second frequency is lower than the first frequency, thereby providing for examining high-frequency clock-masking signal patterns at a reduced frequency.

2. The method as recited in claim 1, further comprising testing the plurality of bits loaded from the third shift register.

3. The method as recited in claim 1, wherein selecting a first mode of the second shift register comprises setting a serial disable bit to a logic low.

4. The method as recited in claim 1, wherein selecting a second mode of the second shift register comprises setting a serial disable bit to a logic high.

5. The method as recited in claim 1, wherein the first shift register comprises a serial/parallel shift register and the third shift register comprises a serial/parallel shift register.

6. The method as recited in claim 1, wherein the first mode of the first shift register comprises a parallel mode and the second mode of the first shift register comprises a serial mode.

7. The method as recited in claim 1, wherein the first mode of the third shift register comprises a parallel mode and the second mode of the third shift register comprises a serial mode.

8. The method as recited in claim 1, wherein loading a plurality of bits on the first shift register further comprises receiving a clock signal and loading the plurality of bits in response to the received clock signal.

9. The method as recited in claim 8, wherein the clock signal is a high frequency clock signal.

10. The method as recited in claim 1, wherein loading a plurality of bits on the third shift register further comprises receiving a clock signal and loading the plurality of bits in response to the received clock signal.

11. The method as recited in claim 1, wherein:
    selecting a first mode of a first shift register is performed by a first serial/parallel shift register;
    loading a plurality of bits on the first shift register at a first frequency is performed by the first serial/parallel shift register;
    selecting a second mode of the first shift register is performed by the first serial/parallel shift register;
    selecting a first mode of a second shift register is performed by a first shift register;
    loading the plurality of bits on the second shift register is performed by the first shift register;
    selecting a second mode of the second shift register is performed by the first shift register;
    selecting a first mode of a third shift register is performed by a second serial/parallel shift register;
    loading the plurality of bits on the third shift register is performed by the second serial/parallel shift register;
    selecting a second mode of the third shift register is performed by the second serial/parallel shift register; and
    loading the plurality of bits from the third shift register at a second frequency, where the second frequency is lower than the first frequency, is performed by the second serial/parallel shift register.

12. A system, comprising:
    a first shift register configured to receive a high frequency clock signal, a first mode select signal, and a plurality of bits;
    the first shift register further configured to load the plurality of bits in a parallel mode or to operate in a serial mode, in response to the first mode select signal;
    a second shift register coupled to the first shift register and configured to receive the high frequency clock signal and a serial disable signal, and to receive the plurality of bits from the first shift register, in response to the serial disable signal;
    a third shift register coupled to the second shift register and configured to receive a low frequency clock signal and a second mode select signal, and to receive the plurality of bits from the second shift register; and
    the third shift register further configured to load the plurality of bits in a parallel mode, in response to the second mode select signal, and to operate in a serial mode, in response to the second mode select signal.

13. The system as recited in claim 12, wherein the first shift register is a serial/parallel shift register and the third shift register is a serial/parallel shift register.

14. The system as recited in claim 12, wherein the high frequency clock is configured at a frequency of at least one gigaHertz.

15. The system as recited in claim 12, wherein the high frequency clock is configured at a frequency of at least five gigaHertz.

16. The system as recited in claim 12, further comprising a test circuit coupled to the third shift register and configured to receive the plurality of bits from the third shift register in a serial mode.

17. The system as recited in claim 12, wherein the first shift register further comprises a parallel/serial select pin configured to receive the first mode select signal.

18. The system as recited in claim 12, wherein the third shift register further comprises a parallel/serial select pin configured to receive the second mode select signal.

19. The system as recited in claim 12, wherein the second shift register further comprises a serial disable pin configured to receive the serial disable signal.

20. A processor for examining high-frequency clock-masking signal patterns at a reduced frequency, the processor including a computer program, comprising:

computer program code for selecting a first mode of a first shift register;

computer program code for loading a plurality of bits on the first shift register at a first frequency;

computer program code for selecting a second mode of the first shift register;

computer program code for selecting a first mode of a second shift register;

computer program code for loading the plurality of bits on the second shift register computer program code for selecting a second mode of the second shift register;

computer program code for selecting a first mode of a third shift register;

computer program code for loading the plurality of bits on the third shift register;

computer program code for selecting a second mode of the third shift register; and computer program code for loading the plurality of bits from the third shift register at a second frequency, where the second frequency is lower than the first frequency, thereby providing for examining high-frequency clock-masking signal patterns at a reduced frequency.

* * * * *